US008767974B1

(12) United States Patent
Lu et al.

(10) Patent No.: US 8,767,974 B1

(45) Date of Patent: Jul. 1, 2014

(54) SYSTEM AND METHOD FOR GENERATING COMFORT NOISE

(75) Inventors: Youhong Lu, Vernon Hills, IL (US); Ronald Fowler, Westford, MA (US); Robert McGurrin, Arlington, MA (US); Jenny Q. Jin, Natick, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2211 days.

(21) Appl. No.: 11/153,673

(22) Filed: Jun. 15, 2005

(51) Int. Cl.
*H04R 3/02* (2006.01)
*H04B 15/00* (2006.01)
*H03G 3/20* (2006.01)

(52) U.S. Cl.
USPC ............................ 381/73.1; 381/57; 381/94.2

(58) Field of Classification Search
USPC .................... 381/73.1, 56–57, 61, 94.1–94.8; 704/215, 223–228, E19.006; 379/22–25, 27.01–31, 391–392.01
See application file for complete search history.

(56) References Cited

U.S. PATENT DOCUMENTS

| | | | | |
|---|---|---|---|---|
| 5,706,394 | A * | 1/1998 | Wynn | 704/219 |
| 6,163,608 | A * | 12/2000 | Romesburg et al. | 379/406.01 |
| 6,658,107 | B1 * | 12/2003 | Sorqvist et al. | 379/406.05 |
| 7,454,010 | B1 * | 11/2008 | Ebenezer | 379/392.01 |
| 2003/0123535 | A1 * | 7/2003 | Nayak | 375/229 |
| 2004/0146168 | A1 * | 7/2004 | Goubran et al. | 381/73.1 |
| 2004/0204934 | A1 * | 10/2004 | Stephens et al. | 704/226 |

OTHER PUBLICATIONS

Title: Fast Algorithms for the Discrete W Transform and for the Discrete Fourier Transform Author: Wang, Z Journal: IEEE Transactions on Acoustics, Speech and Signal Processing, vol. ASSP-32 No. 4 Aug. 1984.*

Author Wang Title Fast Algorithms for the Discrete W Transform and for the Discrete Fourier Transform Journal IEEE Transactions on Acoustics Speecha nd Signal Processing Aug. 1984.*

Title: “A voice activity detection algorithm for communication systems with dynamically varying background acoustic noise” Author Ick Don Lee et al 1998 IEEE.*

* cited by examiner

*Primary Examiner* — Xu Mei

(57) ABSTRACT

Comfort noise, such as can be used in voice communications can be generated using methods in the frequency domain and/or in the time domain. In various embodiments, a comfort noise spectrum can be generated in the frequency domain as the product of a background noise sample and a random noise sample. In other embodiments, the comfort noise can be generated directly in the time domain as the convolution of a background noise sample and a random noise sample.

20 Claims, 3 Drawing Sheets

SYSTEM AND METHOD FOR GENERATING COMFORT NOISE

FIELD OF THE INVENTION

This invention relates generally to voice communications in wired and wireless networks. More specifically, it relates to systems and methods for generation of comfort noise during voice communications.

BACKGROUND OF THE INVENTION

Users of both wired devices (e.g., plain old telephone services ("POTS") devices) and wireless devices (e.g., mobile phones) commonly engage in voice communications. In a typical application, a user will place a call to another user, such as by dialing the phone number of the other user. In a POTS system, the call is completed over a dedicated circuit switched connection between the two devices. That is, the circuited switched connection is used exclusively to carry voice traffic for the connection between the two devices; it is not used to carry voice or data for other connections. Once the connection is established, the two users can engage in voice communications.

As networks have evolved, the traditional circuit switched connection has been replaced with packet based communications. In packet based communications (e.g., Voice over Internet Protocol ("VoIP")), digital packets are used to carry the voice traffic between the devices rather than the analog methods that are used in POTS systems. One advantage of packet based communications is that it is no longer necessary to establish a dedicated connection between the two devices. Thus, in a packet based communications, bandwidth that is not used for the call can be used to carry voice or data for other connections.

A dedicated circuit switched connection continuously transmits voice traffic even when the two users are not talking. As POTS users experience, continuous transmission between the devices this results in a certain amount of background noise that is always present on the line. Thus, the users typically never experience true silence on the line. For packet based communications, however, when the users are not talking, packets are not sent between the devices and the bandwidth can be used for other applications. This, however, can result in a stark silence on the line, which causes many users to questions whether the connection is still active.

In order to combat this problem, many devices now purposefully generate comfort noise to replace the silence that the user might otherwise periodically experience during the connection. In advanced applications, the device attempts to generate comfort noise that not only models the open line sound associated with circuit switched connections, but also imitates background noise that is audible in the background at the speaker's end. The background noise might include vacuums, high pitched sounds, recurring noises or a myriad of other sounds.

Current applications for generating comfort noise oftentimes must employ very high order filters in order to accurately model the background noise and to generate comfort noise that spectrally matches the background noise. Such high order filters not only increase the complexity of the applications for generating comfort noise but also increase their computational cost. That is, these applications might use a larger amount of the device's available computational resources and power. This might not only slow down the speed at which the comfort noise itself can be generated but might also slow down other applications running on the device as well.

Therefore, there exists a need for improved methods and systems for generating comfort noise.

SUMMARY OF THE INVENTION

Comfort noise, such as can be used in voice communications between devices, can be generated in the frequency domain or in the time domain. In various embodiments, a comfort noise spectrum can be generated in the frequency domain as the product of a frequency response of a segment of background noise samples and a segment of random noise samples. For example, a segment of samples of the background noise can be first obtained in the time domain and then converted into the frequency domain, such as by a Fourier Transform, an N-point Discrete Fourier Transform, a sine transform, a cosine transform or some other method. Once the comfort noise spectrum is obtained in the frequency domain, it can then be converted back to the time domain and used to generate the comfort noise that is ultimately presented to a user of a device.

In other embodiments, the comfort noise can be computed directly in the time domain, such as by a convolution of a segment of background noise samples detected and a random noise sample sequence locally generated. In various embodiments, the random noise sequence might be a random pulse sequence. The pulse sequence can be selected in a variety of different ways, such as to reduce artificial harmonics that might otherwise be heard in the resulting comfort noise.

These as well as other aspects and advantages of the present invention will become apparent from reading the following detailed description, with appropriate reference to the accompanying drawings.

BRIEF DESCRIPTION OF THE DRAWINGS

Exemplary embodiments of the present invention are described herein with reference to the drawings, in which.

DETAILED DESCRIPTION OF EXEMPLARY EMBODIMENTS

Figure 1:
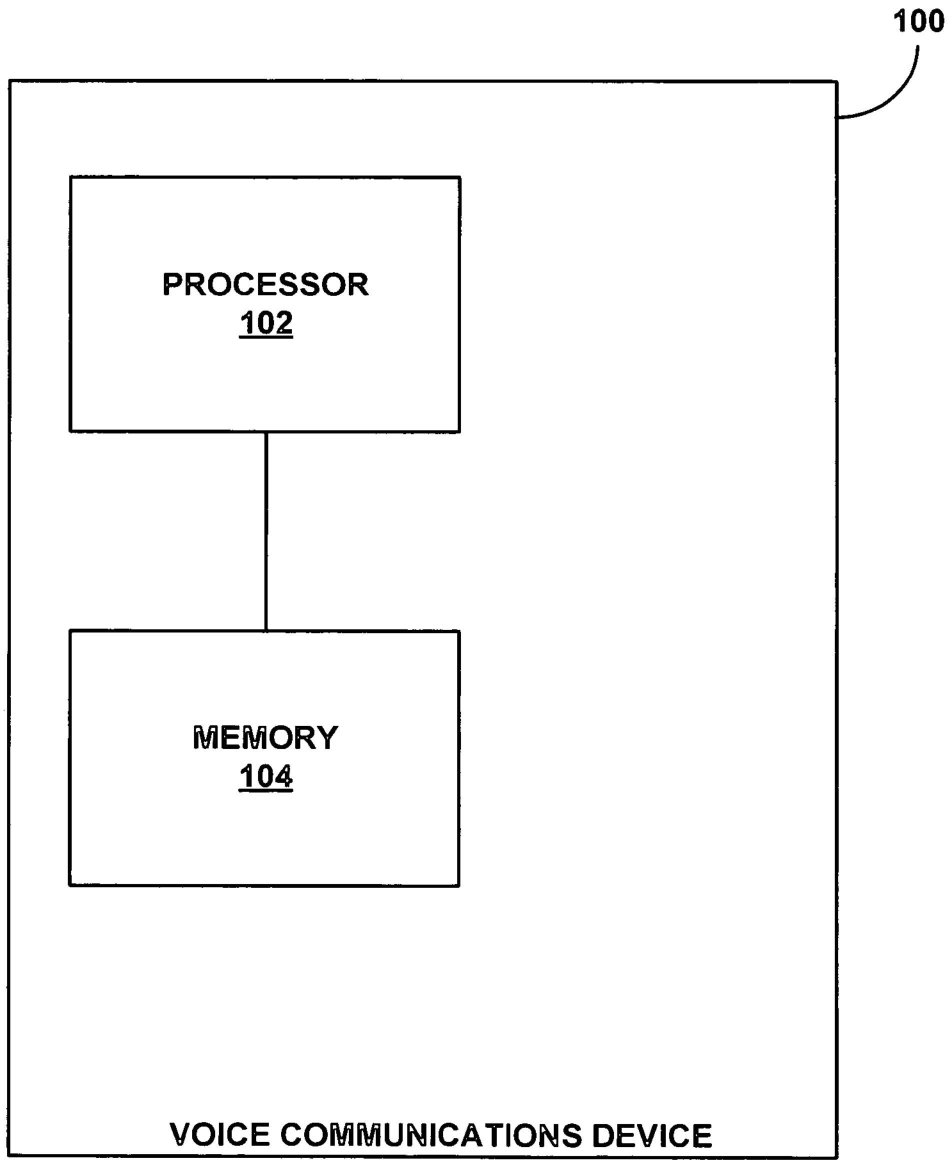
FIG. 1 is a block diagram of a voice communications device that can be used to generate comfort noise, such as by operations in the frequency domain or the time domain.

Comfort noise can be generated by a device and used to replace background noise or at a time when background noise is not otherwise present. An ideal comfort noise generator generates comfort noise that is equivalent to the background noise such that the user cannot tell the difference between the comfort noise and the background noise. In this case, the comfort noise is subjectively the same as the background noise. In practice however, the comfort noise is an approximation of the background noise and does not match it exactly; however, a user might not be able to perceive difference between the two, or the differences between the two perceived by the user might be minimal.

Good comfort noise, defined based on its subjective quality, can be restated in terms of mathematics for generation. That is, a good comfort noise is generated noise that matches the background noise statistically. A signal is said to match another signal statistically if the signal spectrum is generated via multiplication of the spectrum of the other signal with a random spectrum. The expectation of the random spectrum has to be flat. For example, the random spectrum can be from a signal that has the white noise properties. On the other hand, in the time domain, a signal is said to match another signal if the signal is generated via convolution of the other signal with a random noise. The random noise has the properties equal or closer to the white noise properties.

Good comfort noise, therefore, is generated noise that has no difference from the background noise subjectively. In terms of mathematics, the comfort noise is the equivalent to the background noise statistically and has the spectrum of the background noise multiplied by the spectrum of a random noise having the properties equal or closer to the white noise properties. To achieve this, one has to not only isolate the pure background noise and determine how to extract its features, but one also has to determine how to generate the comfort noise from these extracted features. The noise that is ultimately generated should be statistically equivalent to the background noise, and it should be inserted where the background noise was removed.

Many applications in voice communications systems employ comfort noise. Two such applications are echo cancellation and noise suppression. However, these two applications are merely examples, and the principles of conformation noise generation discussed herein may be applied to other applications as well.

In an exemplary echo cancellation application, a residual echo after a linear echo cancellation has to be removed. The block used to remove the residual echo is oftentimes called the nonlinear processor ("NLP"). The NLP suppresses both the local signal and the residual echo, which are indiscernibly combined. If the residual echo were not suppressed, the residual echo would return to the remote user and cause not only a very distracting echo but also an unacceptable degradation of quality.

When such suppression by the NLP occurs, the local user's signal no longer makes it to the remote terminal. This is an undesirable but inevitable side-effect of eliminating the residual echo. Despite this, no words are usually lost in the conversation because only one user at a time speaks during normal dialogue. However, the actual background noise present at the local end no longer reaches the remote user, causing an unpleasant discontinuity. To circumvent this problem, a good NLP replaces any suppressed local background noise by an artificially generated comfort noise, which preferably is subjectively indistinguishable from the original background noise.

Another application that is frequently used in packet based networks and wireless networks is noise suppression. Noise suppression is usually related to the discontinuity transmission. One of the goals of a packet based voice network or wireless network is to reduce both the required power and bandwidth for voice communications. One common method is to make use of a technique sometimes referred to as silence suppression. Noise suppression algorithms cease sending a signal when no voice is present; this is called a silence period even though there may still be background noise present.

Since a person typically speaks only half the time, this can potentially reduces transmission bandwidth and power by about half. Bandwidth is especially costly in wireless infrastructure, and low power consumption is important for battery-operated devices such as mobile phones. In such networks, the noise or noise feature package will be sent to remote sides once at the beginning of the silence period or periodically with a relative large period. In the second case, the noise properties can be tracked for slow-varying noises. In the remote terminal, the comfort noise is generated for the continuous transmission.

When there is no near-end speech, the received signal is generally only the background noise. The noise can be saved for extracting noise features, which are subsequently used to generate comfort noise that matches the background noise. The saved noise can be updated as long as there is no near-end speech contained in the received signal. If the length of the saved noise is allowed to be more than a few hundred milliseconds, the comfort noise generation can be achieved simply by inserting the saved noise repeatedly. Preferably, the length of saved noise is short enough to save memory and transmission bandwidth but still long enough to keep all noise properties. The length of the saved noise can be, for example, between 10 and 30 ms. However, these are merely examples and greater or shorter lengths might alternatively be used.

Comfort noise generation can be based on the saved noise power level and linear prediction coefficients ("LPC") extracted from the saved noise. Let h(k) be the segment of the background noise with $0 \le k \le N$ detected in a short period time. Then the power level can be computed as $$E = \sqrt{\frac{1}{N}\sum_{k=0}^{N}|h(k)|^2}. \tag{1}$$

The power level in (1) can also be estimated using other techniques. One example is using a moving average. For the silence suppression combined with a speech coding scheme, one usually does not compute the noise power. Instead, the power level of the residual signal resulting from LPC filtering of the background noise is computed. In this case, the special excitation is required for the comfort noise generation to match the background noise residue.

The LPC is a vector. Using LPC, one can estimate next samples based on the previous available samples. Let $\{a_i | 1 \le i \le P\}$ be the LPC, where P is called the order of LPC, then $$\hat{h}(k) = \sum_{i=1}^{P} a_i h(k-i). \tag{2}$$

Signal $\hat{h}$ (k) is the estimation of h(k). The estimation error is defined as $$e(k) = h(k) - \hat{h}(k). \tag{3}$$

The LPC are computed via minimizing the expectation of e(k). There are many ways to compute the LPC that minimizes the expectation of e(k). A preferable way is by using the Levinson-Durbin algorithm.

For echo cancellation applications, the comfort noise is generated using the computed power level and LPC, and it is inserted in the place where the combination of the residual echo and the background noise is removed. In the noise suppression application, the saved power level and LPC are packetized and transmitted via voice networks, for example, wireless and packet networks. The transmission of such packets may occur periodically or once, such as at the beginning of the noise segments. The transmission may also occur only at the time when the change of the extracted features is beyond a threshold.

In both echo cancellation and noise suppression applications, the comfort noise is generated and played out to smooth the voice conversation. The generation algorithm where a speech coding is not used, however, may be different from the generation where a speech coding is used. When a speech coding is not used, the comfort noise generation can be described as $$y_1(k) = \sum_{i=1}^{P} a_i y_1(k-i) + G_1 x(k), \text{ and } y(k) = E y_1(k)/G \quad (4)$$

The gain $G_1$ is chosen such that $y_1(k)$ is in the certain range and the gain G is the power level of $y_1(k)$. The signal x(k) in (4) is locally generated random white noise or a noise having the white noise properties.

When a speech coding is used, this technique can be still used. The comfort noise quality, however, may be low since the random white noise might not be enough to match the background noise. In a speech coding, the original signal properties are retained by encoding both the LPC and the residue. Comfort noise generation, therefore, may use special excitation when a speech coding is used. For example, the comfort noise can be generated by $$y(k) = \sum_{i=1}^{P} a_i y(k-i) + G_1 x_1(k) + G_2 x_2(k) + G_3 x_3(k). \quad (5)$$

Where $x_1(k)$ is the excitation produced by randomly choosing a lag greater than 40, $G_1$ is the gain randomly chosen from 0 to 0.5, $x_2(k)$ is a Gaussian white noise, $G_2$ is equal to 0.25 of the total residual gain, $x_3(k)$ is a random excitation formed by four pulses chosen randomly from possible pulse locations, and $G_3$ is chosen such that the global excitation power level is equal to the power level of the background noise residue.

Background noises come in many varieties if they are observed in the time domain. They can be classified in terms of environments, such as office ventilation noise, car noise, street noise, cocktail noise, background music, etc. . . . Although this classification is practical for human understanding, the algorithms that model and produce the comfort noise operate in mathematical terms.

The most basic and intuitive property of the background noise is its loudness. This is referred to as the signal's power level. One less obvious property is the frequency distribution of the signal. For example, the hum of a running car and that of a vacuum cleaner can have the same power level, yet they do not sound the same. These two signals have distinctly different spectrums. Good comfort noise algorithms preferably work well with many or all types of the background noise. That is, the generated comfort noise would match the original signal as closely as possible so that a listener would perceive little or no difference between the background noise and the comfort noise.

The algorithms of the comfort noise generation based on (4) are usually referred as a frequency-shaping technique. The spectrum envelope of the random noise x(k) is flat and the spectrum envelop of the synthesis filter constructed using LPC is smoothed version of the spectrum envelope of the background noise. The spectrum of the comfort noise based on (4), therefore, matches the envelope of the background noise spectrum. Thus, the spectrum of the comfort noise usually cannot match the spectrum of the background noise unless the order of the LPC is very high or the spectrum of the background noise is very smooth and closer to its envelope. As a result, the generated comfort noise can sound different from the actual background.

To compensate the spectrum distortion due to the limited order of LPC, many speech coders add the spectrum difference information using the special excitation source based on the fixed and adaptive codebooks. The idea is also used in comfort noise generation, which was mathematically described by (5). It is, however, difficult to judge the comfort noise quality mathematically unless the lag, positions of four pulses, and all gains are from the speech encoder, which is not the case since only LPC and the residual gain are contained in a comfort noise frame. In addition, the computational cost for (5) is very high. Also, both (4) and (5) require the computation of LPC, which requires a lot of memory and processor time even though the recursive Levison-Durbin algorithm is used.

As previously discussed, linear prediction coefficients try to match the background noise spectrum in shape but cannot perfectly reflect actual spectrum of the background noise. The spectrum of the generated noise based on the LPC coefficients is smoothed version of the detected background noise. There is, therefore, a subjective difference between background noise and the comfort noise. The difference is higher when the order of LPC coefficients is smaller since the spectrum is getting smoother when the order is getting smaller. As a result, a user can still hear noise when the device switches between the background noise and the comfort noise. To generate high quality background noise, one has to use very higher order in the linear prediction. The computational complexity will exponentially increase with the order increase.

Given a segment of background noise, it is desired that the spectrum of the generated noise match the spectrum of the background noise. In other words, it is preferred that all the information of the background noise is retained. Using the limited order of LPC, however, the different background environments cannot be precisely modeled because all the information of the background noise cannot be retained.

It is generally assumed that the background noise varies slowly with time. In a short time period, the spectrum of the background noise is assumed to be the same statistically. In other words, the spectrum of the generated comfort noise can be the spectrum of the background noise multiplied by a random white noise spectrum.

In one example of computing comfort noise, the voice signal can be a digital signal with the sampling rate of 8000 Hz. Y(m) is the spectrum of the background noise with bin m from 0 to 4000 Hz. N(m) is random white noise with $0 \le m \le 4000$. It should be understood, however, that these sampling rates and resulting signals are merely exemplary in nature. Other sampling rates might alternatively be used. Regardless of the particular sampling rate used and the methods for obtaining these signals, the comfort noise spectrum is defined as:

$$\hat{Y}(m) = Y(m)N(m). \quad (6)$$

That is, to obtain Y(m), the background noise can be sampled in the time domain and then converted to the frequency domain, such as by using a Fourier Transform. The random white noise can similarly be created in the time domain and then converted to the frequency domain, or alternatively it might be created directly in the frequency domain. The comfort noise spectrum in the frequency domain is then simply the product of Y(m) and N(m) in the frequency domain.

The inverse Discrete Fourier Transform ("DFT") can then be used to generate the comfort noise in the time domain by converting the comfort noise spectrum from the frequency domain to the time domain. After scaling the signal to match the power level of the background noise, the comfort noise is ideally same as the background noise subjectively, although due to various operational factors this might vary somewhat in practice. In other words, over a short period of time a user ideally would not be able to tell the difference between listening to the comfort noise and listening to the background noise.

In practice, however, (6) is not usually a preferred way to generate the comfort noise, because the large length of the DFT makes its computational cost very large. Since the length of the saved background noise is usually between 10 to 32 ms, corresponding to 80 to 256 samples, the computational cost of the comfort noise generation in (6) can be reduced.

As the second example of computing comfort noise, h(k) is the segment of the background noise with 0≤k≤N, where N is between 80 to 256. Its spectrum in the frequency domain is given by Y(m), with 0≤m≤N, computed via the N-point DFT. That is, h(k) is the background noise sampled in the time domain, and the N-point DFT is used to convert h(k) into the frequency domain, resulting in the signal Y(m). N(m) is a random white noise spectrum with 0≤m≤N. The computational cost based on (6) is much cheaper now.

When the inverse DFT is included and the Fast Fourier Transform (FFT) is used to implement the DFT and inverse DFT, the computation requires $(2N \log_2(N)+N)/N=1+2 \log_2(N)$ multiplication operations per sample. For example, 17 multiplication operations are used when N=256. The comfort noise generation is done block-by-block. For the next block, the other random noise spectrum N(m) is generated and the comfort noise is still computed via (6).

The comfort noise generation based on (6) requires phase information for doing the inverse DFT to generate samples in the time domain. To simplify the comfort noise generation, the cosine or sine transform can be used. If Y(m) in (6) is the discrete cosine or sine transform of the background noise, and N(m) is a noise having white noise properties, then (6) defines the discrete cosine or sine transform of the comfort noise. By doing the inverse discrete cosine or sine transform, the comfort noise can be generated in the time domain. For example, Y(m) can be generated by the cosine transform of h(k), which is given by $$Y(m) = \sqrt{\frac{2}{N}} \sum_{k=0}^{N-1} h(k)\cos\left(\pi\frac{(k+0.5)(m+0.5)}{N}\right) \tag{7}$$

Alternatively, the sine transform might be used in (7) instead of the cosine transform. After computation in (6), the comfort noise samples in the time domain can be generated by using the inverse sine or cosine transform.

These computations address comfort noise generation in accordance with the definition of a good comfort noise, and comfort noise generation according to these methods requires operations in the frequency domain. Alternatively, comfort noise generation can occur in the time domain. The comfort noise generated in the time domain is equivalent to the comfort noise generated via the frequency operations in the frequency domain. The computation, however, is simpler since the DFT is saved.

In one example of generating the comfort noise directly in the time domain, n(k) is generated via a pseudo random noise generator. The spectrum of the pseudo random noise is flat statistically. h(i) is again the background noise sampled in the time domain. The comfort noise sequence can be constructed as:

$$x(n) = \sum_{i=0}^{N-1} h(i)n(k-i) \tag{8}$$

Thus, in this embodiment, x(n) is the convolution of the background noise segment h(k) and the random noise n(k). The spectrum of x(k) is the multiplication of the spectrum of the background noise h(k) and the spectrum of the random noise n(k).

The computational cost based on Equation (8), however, is relatively high. N multiplication operations are required. To reduce implementation cost and to increase the flatness of spectrum of random noise, a random pulse sequence can be constructed as:

$$r(k) = \sum_{i=0}^{\infty} n(i)\delta(k-iM_i) \tag{10}$$

In this embodiment, n(i) is a pseudo random noise sequence. {Mi} defines the pulse positions and is a sequence of integers such that 0<Mi<N. The integers Mi should preferably be well less than N so that no artificial harmonics are heard. In this case:

$$x(k) = \sum_{i=0}^{\infty} n(i)h(n-iM_i) \tag{11}$$

That is, in (8) if we use r(k) instead of n(k), the resulting computation of the comfort noise is given by (11). Although index seems going to infinitive, it actually takes a few integers since the length of h(k) is N. Where computing the comfort noise via (8) uses N multiplications, computing the comfort noise via (11) uses only N/Mi multiplications. Thus, (11) provides an added computational savings over (8).

One example for choosing the integers Mi is in the noise suppression application where a scheme of speech coding is used. Mi are the pulse positions from the last active voice frame or sub-frame. Using G.729 as an example, the first four pulse positions are fixed from the last active voice sub-frame and the rest are realized by repeating the first four pulse positions. In each 10 samples, there is a pulse position. The multiplication operations are N/10. For example, there are 16 multiplication operations when N=160, corresponding to 20 ms.

Another realization to (11) is randomly choosing a pulse position from 0 to M−1 for every M samples. In this case, the multiplication operations are N/M. The simplest realization is choosing $M_1$=M, an fixed integer. In this case, $$x(n) = \sum_{i=0}^{\infty} n(i)h(n-iM) \tag{12}$$

According to (12), the number of multiplication operations is N/M. If, for example, N=240 and M=8, then there are 30 multiplication operations. A choice of N/M>3 will generally produce good comfort noise subjectively. If N/M≤3, artificial harmonics might occur that can be heard by the user, which is not preferable. This algorithm for the comfort noise generation is not only very simple, but also has good performance in that there is no noticeable power level variation in each short-term window. In addition, the factor M can be chosen larger to save computational cost. That is, n(i) in (12) can be chosen such that it is a constant with a random sign.

FIG. 1 is a block diagram of a voice communications device that can be used to generate comfort noise, such as by operations in the frequency domain or the time domain. The voice communications device might be a wireless device (e.g., a mobile phone, a personal digital assistant ("PDA") or some other wireless device for voice communications) or it might be a wired device. The voice communications device might use voice over Internet Protocol ("VoIP") or some other standard for supporting voice communications with other devices. In addition to voice communications, the device might also support data communications.

As illustrated in FIG. 1, the voice communications device might include a processor 102 and memory 104, such as for storing executable program code, data or other information. The memory 104 is preferably non-volatile memory, such as ROM, EPROM, EEPROM, a hard drive or some other type of memory. The device might additionally include more than one type of memory. The processor 102 can then retrieve executable program code stored in the memory 104 for execution on the processor.

Figure 2:
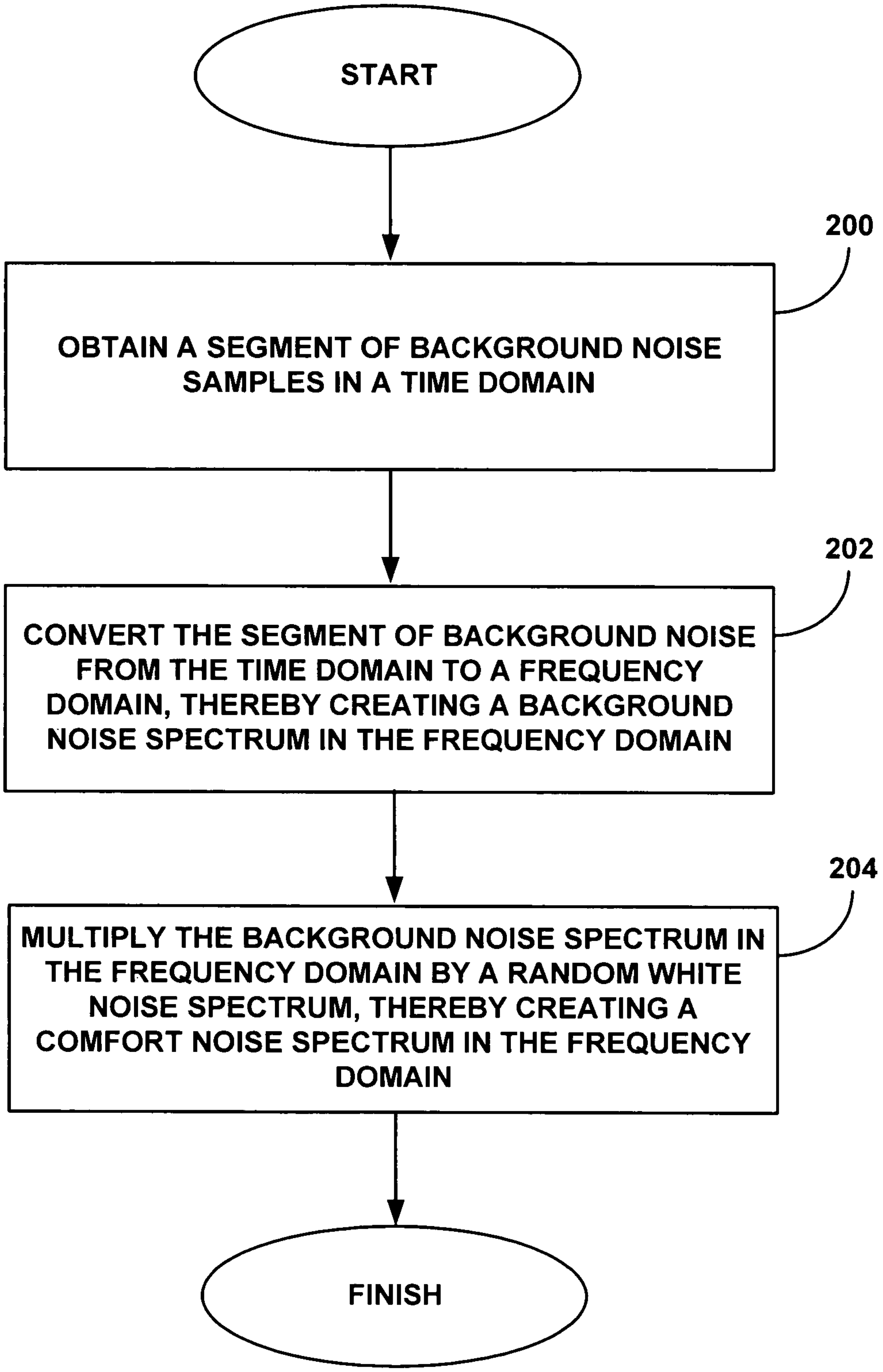
FIG. 2 is flowchart of an exemplary process for generating comfort noise in the frequency domain.

FIG. 2 is flowchart of an exemplary process for generating comfort noise in the frequency domain. This method might be used, for example, by the voice communications device of FIG. 1 to generate comfort noise to be outputted to a user of the voice communications device. At Step 200, the device obtains a segment of background noise samples in a time domain. For example, the voice communications device might be in a current communication session with another device. The voice communications device might obtain the samples of the background noise by taking samples on the communication link with the other device. The samples might be taken while one or both of the users of the devices are talking, in which case the voice traffic might be filtered out. Alternatively, the samples might be taken at a time when neither user is talking.

The samples might be taken at a sampling rate, which can vary depending on the particular parameters used for the voice communication and the particular implementation of the method. In one preferred embodiment, the sampling rate is at least 8000 Hz, which is approximately twice the bandwidth of the standard 4000 Hz bandwidth employed for traditional voice calls. Additionally, the length of the sample can vary, such as according to different implementations of the method.

At Step 202, the device converts the segment of background noise from the time domain to a frequency domain, thereby creating a background noise spectrum in the frequency domain. As previously described, the device might convert the sample from the time domain to the frequency domain using a variety of different methods, such as a Fourier Transform, an N-point Discrete Fourier Transform, a sine transform, a cosine transform or some other method.

At Step 204, the device multiplies the background noise spectrum in the frequency domain by a random while noise spectrum, thereby creating a comfort noise spectrum in the frequency domain. That is, the comfort noise spectrum can be the product of the background noise spectrum and while noise, both in the frequency domain. In one embodiment, the random white noise spectrum could be just a segment of pseudo noise. Once the comfort noise spectrum is generated, it might then be converted back to the time domain in order to generate the comfort noise that is subsequently outputted to a user of the device.

Figure 3:
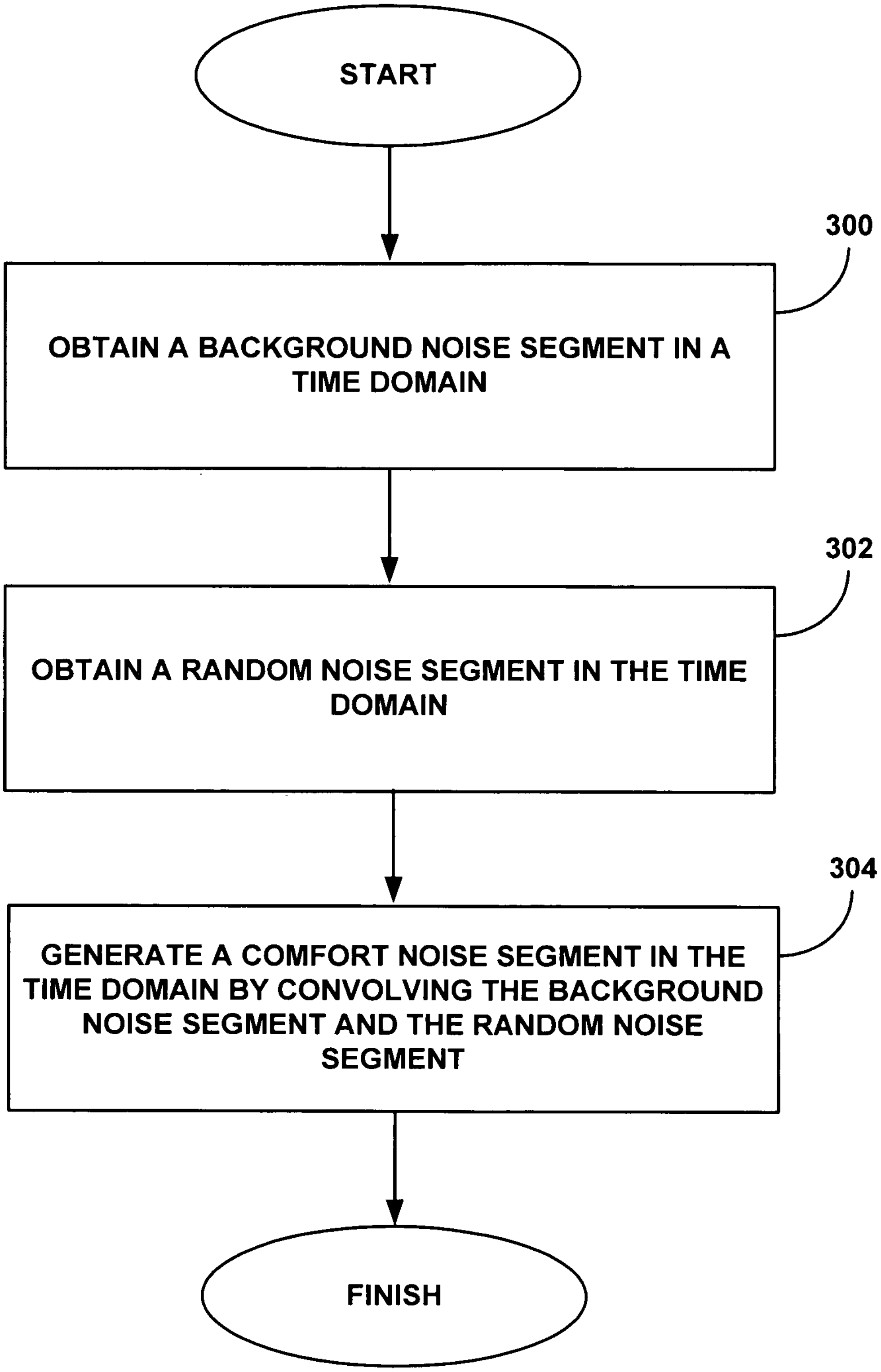
FIG. 3 is a flowchart of an exemplary process for generating comfort noise in the time domain.

FIG. 3 is a flowchart of an exemplary process for generating comfort noise in the time domain. This method might also be used by the device of FIG. 1. At Step 300, the device obtains a background noise segment in a time domain. As previously described, the device might obtain the background noise segment by sampling a connection with another device. At Step 302, the device obtains a random noise segment in the time domain.

At Step 304, the device generates a comfort noise segment in the time domain by convolving the background noise segment and the random noise segment. Thus, in contrast to the method of FIG. 2 where the comfort noise was generated by a product of two signals in the frequency domain, this method generates the comfort noise directly in the time domain.

It should be understood that the programs, processes, methods and apparatus described herein are not related or limited to any particular type of computer or network apparatus (hardware or software), unless indicated otherwise. Various types of general purpose or specialized computer apparatus may be used with or perform operations in accordance with the teachings described herein. While various elements of the preferred embodiments have been described as being implemented in software, in other embodiments hardware or firmware implementations may alternatively be used, and vice-versa.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more, fewer or other elements may be used in the block diagrams. The claims should not be read as limited to the described order or elements unless stated to that effect.

In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

We claim:

1. A method for generating comfort noise, the method comprising:

obtaining a sample of background noise and voice communications of at least two users in a time domain at a communication device, wherein the communication device is used to transmit and receive the voice communications between the at least two users;

filtering the voice communications from the sample of background noise and voice communications to obtain a filtered sample of background noise;

converting, by the communication device, the filtered sample of background noise, without converting the voice communications of the at least two users, from the time domain to a frequency domain, thereby creating a background noise spectrum in the frequency domain; and multiplying, by the communication device, the background noise spectrum in the frequency domain by a random white noise spectrum, thereby creating a comfort noise spectrum in the frequency domain.

2. A non-transitory computer readable medium having stored therein instructions for causing a processor to execute the method of claim 1.

3. The method of claim 1, further comprising converting the comfort noise spectrum in the frequency domain to the time domain.

4. The method of claim 3, wherein an inverse Discrete Fourier Transform is used to convert the comfort noise spectrum in the frequency domain to the time domain.

5. The method of claim 3, further comprising scaling a power level of the comfort noise in the time domain to approximately match a power level of the sample of the background noise in the time domain.

6. The method of claim 1, wherein converting the sample of background noise from the time domain to a frequency domain comprises performing a Fourier Transform on the sample of background noise in the time domain.

7. The method of claim 1, wherein the sample of the background noise in the time domain is given by h(k) with 0<=k<N and wherein N is between 80 and 256 inclusive, and wherein converting the sample of background noise from the time domain to a frequency domain comprises taking the N-point Discrete Fourier Transform ("DFT") of h(k).

8. The method of claim 1, wherein converting the sample of background noise from the time domain to a frequency domain comprises performing a cosine transform or a sine transform on the sample of background noise in the time domain.

9. The method of claim 8, wherein the sample of the background noise in the time domain is given by h(k) with 0<=k<N and wherein N is between 80 and 256 inclusive, wherein the background noise spectrum in the frequency domain is given by Y(m), and wherein performing the cosine transform on the sample of background noise in the time domain comprises performing the cosine transform on h(k) according to the formula $$Y(m) - \sqrt{\frac{2}{N}}\sum_{k=0}^{N-1} h(k)\cos\left(\pi\frac{(k+0.5)(m+0.5)}{N}\right.$$

so as to obtain Y(m).

10. The method of claim 8, further comprising performing an inverse cosine transform or an inverse sine transform on the comfort noise spectrum in the frequency domain so as to convert the comfort noise spectrum to the time domain.

11. The method of claim 1, wherein obtaining the sample of background noise in a time domain comprises sampling, at a sampling rate of at least 8000 Hz, a signal on a voice connection currently established between two devices.

12. A method for generating comfort noise, the method comprising:

filtering voice communication from background noise to obtain a background noise segment in a time domain at a communication device;

obtaining a random noise segment in the time domain at the communication device; and generating, by the communication device, a comfort noise segment in the time domain by convolving the background noise segment and the random noise segment.

13. A non-transitory computer readable medium having stored therein instructions for causing a processor to execute the method of claim 12.

14. The method of claim 12, wherein n(k) represents the random noise segment, wherein h(i) represents the background noise segment, wherein x(n) represents the comfort noise segment, and wherein the x(n) is obtained according to the formula $$x(n) = \sum_{i=0}^{N-1} h(i)n(k-i).$$

15. The method of claim 12, wherein obtaining a random noise segment in the time domain comprises converting the random noise segment to a random pulse sequence.

16. The method of claim 12, wherein obtaining a random noise segment in the time domain comprises converting the random noise segment to a random pulse sequence according to the formula $$r(k) = \sum_{i=0}^{\infty} n(i)\delta(k-iM_i),$$

wherein n(i) represents the random noise segment and r(k) represents the random pulse sequence, and wherein {Mi} defines pulse positions and is a sequence of integers such that 0<Mi<N.

17. The method of claim 16, wherein {Mi} is chosen so as to substantially minimize artificial harmonics.

18. The method of claim 16, wherein generating a comfort noise segment in the time domain by convolving the background noise segment and the random noise segment comprises generating the comfort noise segment in the time domain by convolving the background noise segment with the random pulse sequence.

19. The method of claim 16, wherein generating a comfort noise segment in the time domain by convolving the background noise segment and the random noise segment comprises generating the comfort noise segment in the time domain by convolving the background noise segment with the random pulse sequence according to the formula $$x(k) = \sum_{i=0}^{\infty} n(i)h(n-iM_i).$$

20. A device for voice communications between at least two users, the device including:

a processor;

a memory; and code stored in the memory and executable on the processor to:

obtain a sample of background noise and voice communications of the at least two users in a time domain, filter the voice communications from the sample of background and voice communications to obtain a filtered sample of background noise, convert the filtered sample of background noise, without converting the voice communications of the at least two users, from the time domain to a frequency domain, thereby creating a background noise spectrum in the frequency domain, multiply the background noise spectrum in the frequency domain by a random white noise spectrum, thereby creating a comfort noise spectrum in the frequency domain, convert the comfort noise spectrum in the frequency domain to a time domain, and output the comfort noise to a user of the device.

* * * * *

UNITED STATES PATENT AND TRADEMARK OFFICE

CERTIFICATE OF CORRECTION

PATENT NO. : 8,767,974 B1
APPLICATION NO. : 11/153673
DATED : July 1, 2014
INVENTOR(S) : Youhong Lu et al.

It is certified that error appears in the above-identified patent and that said Letters Patent is hereby corrected as shown below:

In the Claims

Column 11, line 40, in Claim 9, delete " $Y(m) - \sqrt{\frac{2}{N}}\sum_{k=0}^{N-1} h(k)\cos\left(\pi\frac{(k+0.5)(m+0.5)}{N}\right.$ " and insert -- $Y(m) = \sqrt{\frac{2}{N}}\sum_{k=0}^{N-1} h(k)\cos(\pi\frac{(k+0.5)(m+0.5)}{N})$ --, therefor.

Signed and Sealed this
Seventh Day of October, 2014

Michelle K. Lee
*Deputy Director of the United States Patent and Trademark Office*